(12) United States Patent
Nishii (10) Patent No.: US 7,624,502 B2
(45) Date of Patent: Dec. 1, 2009

(54) METHOD FOR PRODUCING CIRCUIT-FORMING BOARD AND MATERIAL FOR PRODUCING CIRCUIT-FORMING BOARD

(75) Inventor: Toshihiro Nishii, Osaka (JP)

(73) Assignee: Panasonic Corporation, Osaka (JP)

( * ) Notice: Subject to any disclaimer, the term of this patent is extended or adjusted under 35 U.S.C. 154(b) by 94 days.

(21) Appl. No.: 10/546,730

(22) PCT Filed: Jan. 21, 2005

(86) PCT No.: PCT/JP2005/000763

§ 371 (c)(1),
(2), (4) Date: Aug. 24, 2005

(87) PCT Pub. No.: WO2005/072037

PCT Pub. Date: Aug. 4, 2005

(65) Prior Publication Data

US 2006/0242827 A1    Nov. 2, 2006

(30) Foreign Application Priority Data

Jan. 26, 2004   (JP) .............................. 2004-016795

(51) Int. Cl.
*H01K 3/10*      (2006.01)
*B32B 37/00*     (2006.01)
*H01R 12/04*     (2006.01)

(52) U.S. Cl. .............................. 29/852; 29/830; 29/831; 29/832; 29/837; 29/846; 156/293; 174/265

(58) Field of Classification Search ................... 29/852, 29/830, 831, 846, 832, 837; 216/13, 19; 252/500, 512, 513, 514; 156/306.3, 306.6, 156/293, 513, 514; 428/209; 174/255, 265, 174/266

See application file for complete search history.

(56) References Cited

U.S. PATENT DOCUMENTS 4,893,404 A * 1/1990 Shirahata et al. .............. 29/852
5,413,838 A   5/1995 Azuma et al.
5,519,177 A * 5/1996 Wang et al. .................. 174/259

(Continued)

FOREIGN PATENT DOCUMENTS

JP          6-209148        7/1994

(Continued)

OTHER PUBLICATIONS

Supplementary European Search Report issued *Apr. 9, 2008* in a European Application that is a foreign counterpart of the present application.

*Primary Examiner*—Minh Trinh
(74) *Attorney, Agent, or Firm*—Wenderoth, Lind & Ponack, L.L.P.

(57) ABSTRACT

A conductive portion is formed in a hole formed in a material sheet. A metal foil is placed on a surface of the material sheet to provide a laminated sheet. The laminated sheet is heated and pressed to provide a circuit-forming board. The metal foil includes a pressure absorption portion and a hard portion adjacent to the pressure absorption portion. The pressure absorption portion has a thickness changing according to a pressure applied thereto. The circuit-forming board provided by this method provides a high-density circuit board of high quality having reliable electrical connection.

20 Claims, 8 Drawing Sheets

U.S. PATENT DOCUMENTS

| | | | |
|---|---|---|---|
| 5,652,042 A * | 7/1997 | Kawakita et al. | 428/209 |
| 5,689,879 A * | 11/1997 | Urasaki et al. | 29/846 |
| 5,741,575 A * | 4/1998 | Asai et al. | 428/209 |
| 5,779,870 A * | 7/1998 | Seip | 205/77 |
| 5,960,538 A * | 10/1999 | Kawakita et al. | 29/847 |
| 6,010,768 A * | 1/2000 | Yasue et al. | 428/209 |
| 6,085,414 A * | 7/2000 | Swarbrick et al. | 29/847 |
| 6,139,777 A * | 10/2000 | Omoya et al. | 252/500 |
| 6,217,988 B1 * | 4/2001 | Yasue et al. | 428/209 |
| 6,239,777 B1 * | 5/2001 | Sugahara et al. | 345/85 |
| 6,248,428 B1 * | 6/2001 | Asai et al. | 428/206 |
| 6,504,705 B2 * | 1/2003 | Shimada et al. | 361/528 |
| 2003/0039811 A1 | 2/2003 | Sugawa et al. | |

FOREIGN PATENT DOCUMENTS

| | | |
|---|---|---|
| JP | 6-268345 | 9/1994 |
| JP | 7-115280 | 5/1995 |
| JP | 9-46041 | 2/1997 |
| JP | 11-251703 | 9/1999 |
| JP | 2002-368043 | 12/2002 |
| JP | 2003-209355 | 7/2003 |

* cited by examiner

METHOD FOR PRODUCING CIRCUIT-FORMING BOARD AND MATERIAL FOR PRODUCING CIRCUIT-FORMING BOARD

TECHNICAL FIELD

The present invention relates to a method of manufacturing a circuit-forming board for providing a circuit board used in various electronic equipment, and to a material for manufacturing the circuit-forming board.

BACKGROUND OF THE INVENTION

As electronic equipment has recently become smaller in size and higher in density, circuit boards having electronic components mounted thereon have shifted from being single-sided circuit boards to double-sided, multi-layer circuit boards. High-density circuit boards capable of integrating an increasing number of circuits and components have accordingly been developed.

FIGS. 5A to 5G are sectional views of a conventional circuit-forming board providing a circuit board for illustrating a method of manufacturing the board disclosed in Japanese Patent Laid-Open Publication No. 6-268345.

Figure 5A:
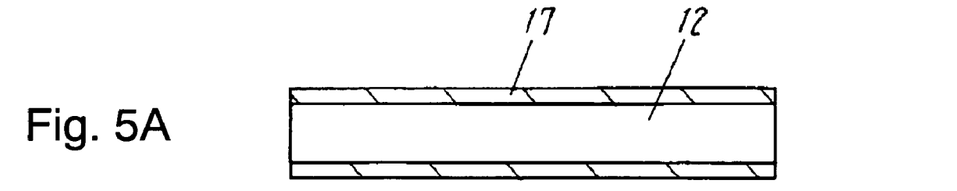
FIG. 5A is a sectional view of a conventional circuit-forming board for illustrating a method of manufacturing the board.

As shown in FIG. 5A, films 17 are attached onto both surfaces of pre-preg sheet 12 by a laminating method using, e.g. a thermal roll. Pre-preg sheet 12 is obtained by drying woven fabric of glass fiber (reinforcing material) impregnated with varnish of thermosetting resin, such as epoxy resin. Pre-preg sheet 12 is in a B-stage and has a thickness of 100 µm. Film 17 is made of polyethylene terephthalate (PET) having a thickness of 20 µm. Film 17 may be coated with thermosetting resin, such as epoxy resin.

Figure 5B:
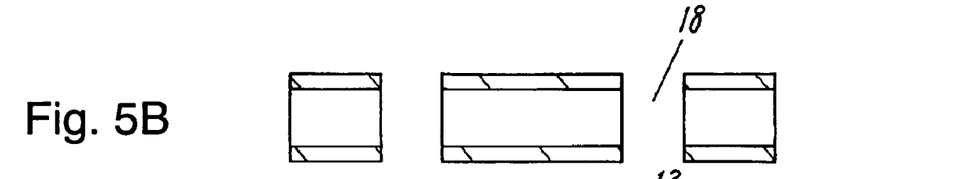
FIG. 5B is a sectional view of the conventional circuit-forming board for illustrating the method of manufacturing the board.

As shown in FIG. 5B, via-holes 18 are formed in pre-preg sheet 12 by a process, such as a laser technology.

Figure 5C:
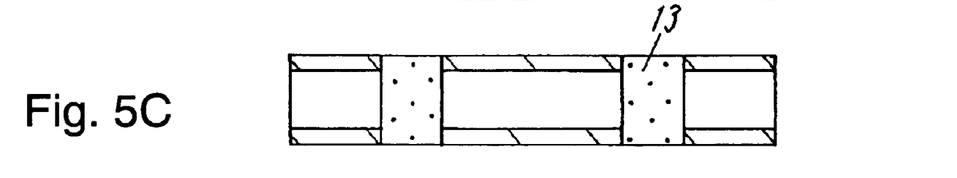
FIG. 5C is a sectional view of the conventional circuit-forming board for illustrating the method of manufacturing the board.
Figure 5D:
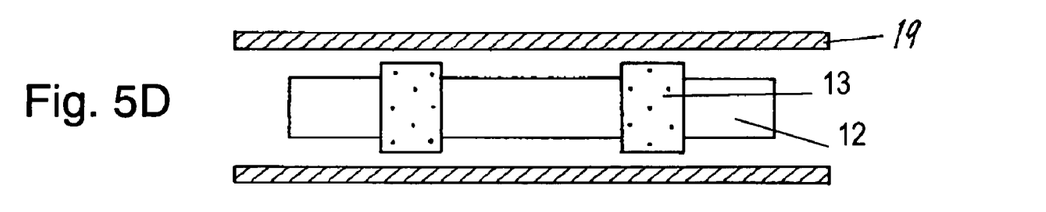
FIG. 5D is a sectional view of the conventional circuit-forming board for illustrating the method of manufacturing the board.

Next, as shown in FIG. 5C, via-holes 18 are filled with conductive paste 13 obtained by kneading thermosetting resin, hardening agent, solvent, and conductive particles, such as copper powder, Then, as shown in FIG. 5D, films 17 are peeled off. Conductive paste 13 protrudes from pre-preg sheet 12. Then, copper foils 19 are placed on both surfaces of pre-preg sheet 12.

Figure 5E:
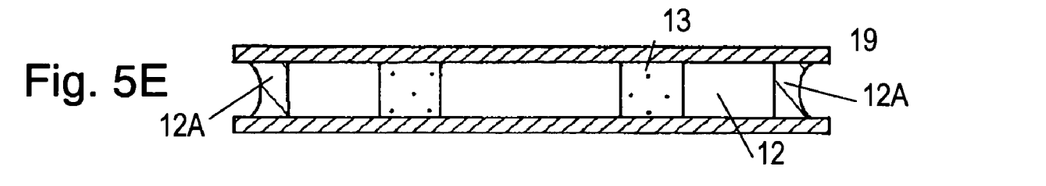
FIG. 5E is a sectional view of the conventional circuit-forming board for illustrating the method of manufacturing the board.

Then, copper foils 19 are pressed by a hot-pressing apparatus (not shown) so as to heat pre-preg sheet 12, copper foils 19, and conductive pastes 13. This operation hardens pre-preg sheet 12 thermally, and compresses conductive paste 13 as to allow conductive paste 13 to be electrically connected to copper foils 19, as shown in FIG. 5E. At this moment, the resin impregnated in pre-preg sheet 12 flows to outsides of pre-preg sheet 12, providing resin 12A.

Figure 5F:
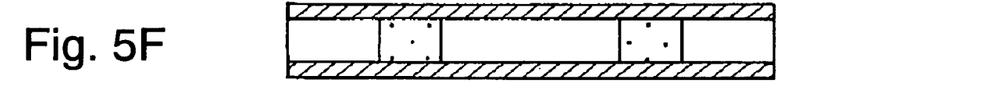
FIG. 5F is a sectional view of the conventional circuit-forming board for illustrating the method of manufacturing the board.
Figure 5G:
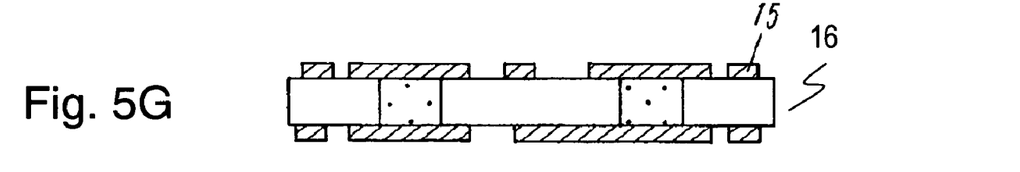
FIG. 5G is a sectional view of the conventional circuit-forming board for illustrating the method of manufacturing the board.
Figure 6A:
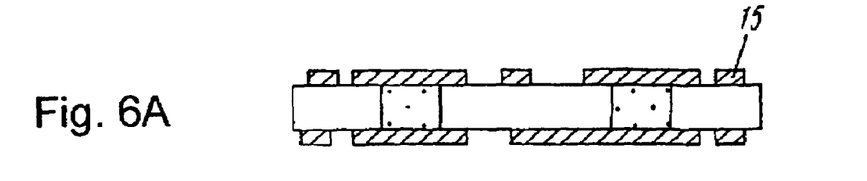
FIG. 6A is a sectional view of a conventional circuit board for illustrating a method of manufacturing the board.
Figure 6B:
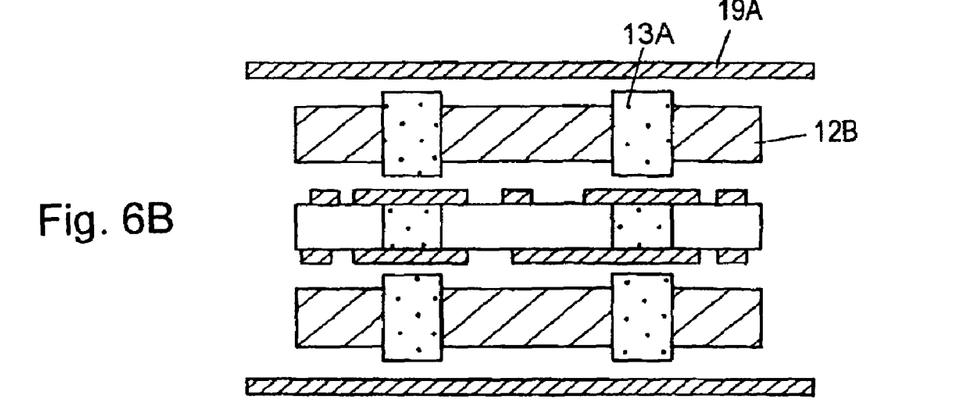
FIG. 6B is a sectional view of the conventional circuit board for illustrating the method of manufacturing the board.
Figure 6C:
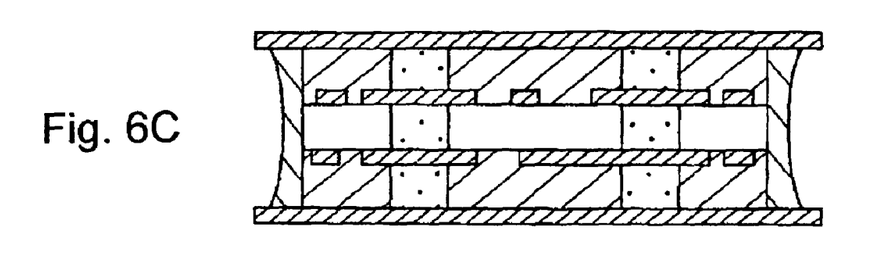
FIG. 6C is a sectional view of the conventional circuit board for illustrating the method of manufacturing the board.
Figure 6D:
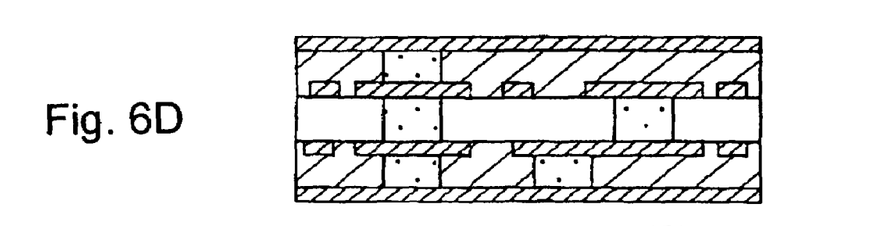
FIG. 6D is a sectional view of the conventional circuit board for illustrating the method of manufacturing the board.
Figure 6E:
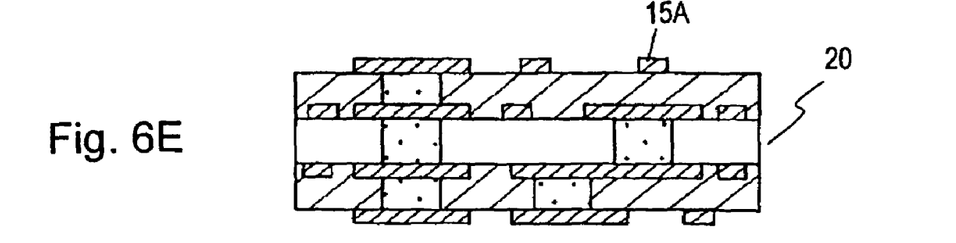
FIG. 6E is a sectional view of the conventional circuit board for illustrating the method of manufacturing the board.

Then, as shown in FIG. 5F, an unnecessary portion at an end is cut off, thus providing the circuit-forming board. Then, copper foils 19 are etched to have predetermined circuit patterns to provide circuit patterns 15 shown in FIG. 5G, thereby providing a double-sided circuit board. This board is cut to provide circuit board 16 having a predetermined size. A solder resist may be formed on circuit pattern 15 in order to prevent the pattern from having an unnecessary solder attached thereto. Circuit patterns 15 may be subjected to a finishing process, such as a plating process.

FIGS. 6A to 6E are sectional views of a multi-layer circuit board obtained by using circuit board 16 manufactured by the method shown in FIGS. 5A to 5G for illustrating a method of manufacturing the multi-layer circuit board. Pre-preg sheets 12B filled with conductive paste 13A and copper foils 19A are positioned and placed on both surfaces of circuit board 16 as a core, and are heated and pressed to provide multi-layer circuit board 20 having circuit patterns 15A on both surfaces thereof.

Figure 7A:
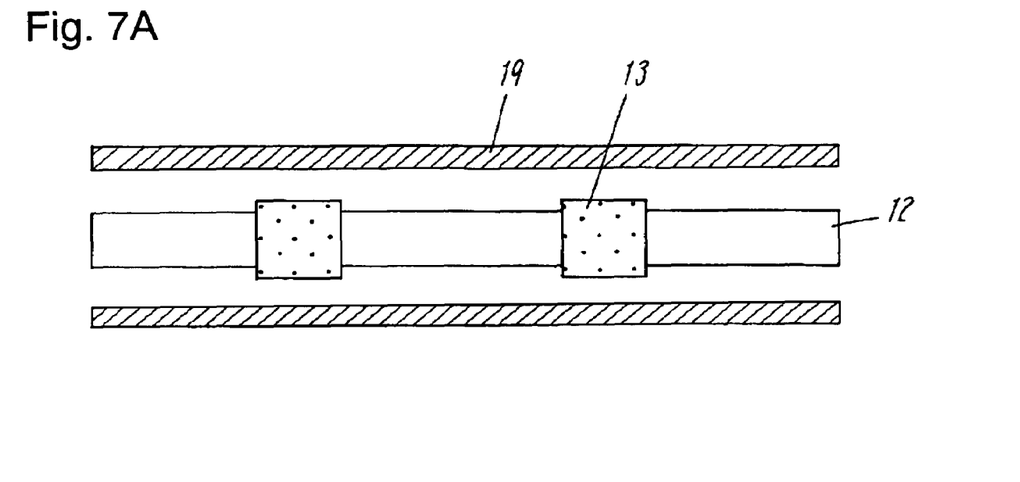
FIG. 7A is a sectional view of the conventional circuit-forming board for illustrating the method of manufacturing the board.
Figure 7B:
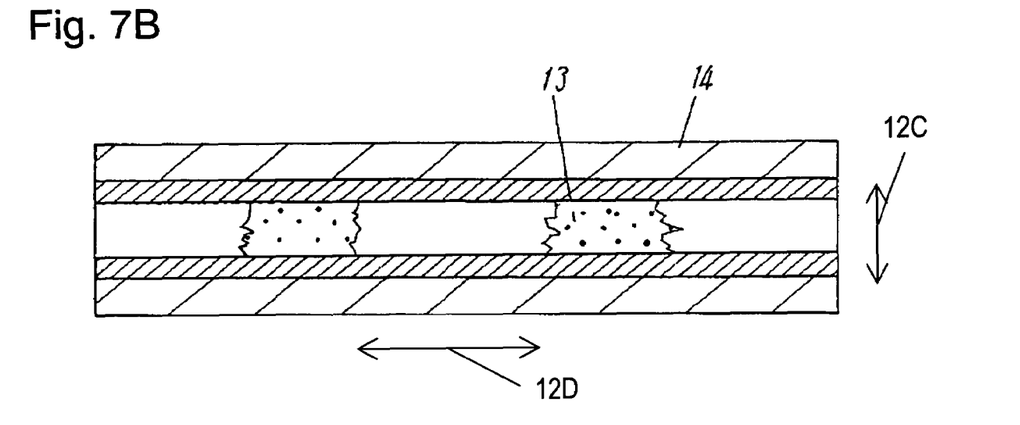
FIG. 7B is a sectional view of the conventional circuit-forming board for illustrating the method of manufacturing the board.
Figure 7C:
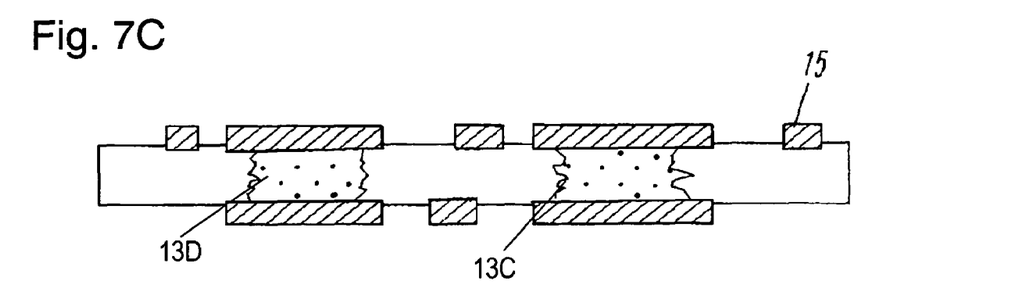
FIG. 7C is a sectional view of the conventional circuit-forming board for illustrating the method of manufacturing the board.

In the method of manufacturing the circuit board shown in FIGS. 5A to 5G, conductive paste 13 and 13A heated and pressed by, e.g. a hot-press apparatus may cause the following problem. FIGS. 7A to 7C are sectional views of the circuit-forming board shown in FIGS. 5A to 5G. As shown in FIG. 7A, copper foils 19 are placed on both surfaces of pre-preg sheet 12 having via-holes 18 filled with conductive paste 13. These are sandwiched between metal plates 14, heated, and pressing, being compressed. A pressure applied to them may cause conductive pastes 13 to deform, distorting the shapes of pastes 13, as shown in FIG. 7B Then, as shown in FIG. 7C, circuit patterns 15 are formed, and conductive pastes 13 become interlayer-connecting portions 13D and 13C adjacent to each other. If the circuit board has a high density, the distance for insulation between interlayer connecting portions 13D and 13C is reduced due to the deformation of conductive paste 13, thereby reducing electrical insulation between the pastes.

When pre-preg sheet 12 is heated and pressed, the resin impregnated into pre-preg sheet 12 flows. When an excessive pressure is applied to conductive paste 13, conductive paste 13 spreads in in-plane direction 12D more than in thickness direction 12C. Thereby, the conductive particles in conductive pastes 13 are not pressed strongly and do not contact each other, so that sufficient electrical connection cannot be obtained. This phenomenon appears significantly if the diameter of each via-hole 18 is smaller than the thickness of pre-preg sheet 12.

As shown in FIGS. 6A to 6E, circuit board 16 as the core has a rough surface provided by circuit patterns 15 and has an uneven thickness, during the manufacturing of multi-layer circuit board 20. The rough surfaces and the uneven thickness of circuit board 16 cause conductive paste 13A on both surfaces to be compressed unstably by the heating and pressing, thereby causing conductive paste 13 to deform more easily.

SUMMARY OF THE INVENTION

A conductive portion is formed in a hole formed in a material sheet. A metal foil is placed on a surface of the material sheet to provide a laminated sheet. The laminated sheet is heated and pressed to provide a circuit-forming board. The metal foil includes a pressure absorption portion and a hard portion adjacent to the pressure absorption portion. The pressure absorption portion has a thickness changing according to a pressure applied thereto.

The circuit-forming board provided by this method provides a high-density circuit board of high quality having reliable electrical connection.

DETAILED DESCRIPTION OF THE PREFERRED EMBODIMENT

FIGS. 1A to 1D are sectional views of a circuit-forming board for illustrating a method of manufacturing the board and a material for manufacturing a circuit board in accordance with an exemplary embodiment of the present invention. FIG. 1E is a schematic view of a processing apparatus for processing copper foil 1 used in the circuit board. Copper foil 1 as a metal foil for manufacturing the circuit-forming board of the embodiment has a thickness of 18 µm. Copper foil 1, a material for manufacturing the circuit-forming board, passes through aqueous solution 1102 of copper sulfate while being conveyed with cathode drum 1101. At this moment, an amount of copper is electrodeposited and grown by electrolytic action on surface 1B of copper foil 1 which does not contact cathode drum 1101, and forms a roughness, thus providing surface 1B with a roughness of a 10-point average roughness (Rz) of about 10 µm. Bump-shaped members of copper are provided on surface 1C of copper foil 1 which is opposite surface 1B and contacts cathode drum 1101 to roughen surface 1C, thus providing surface 1C with a roughness Rz of about 5 µm. Thus, copper foil 1 has pressure absorption portion 1a formed of rough surface 1C. Similarly to pre-preg sheet 12 shown in FIGS. 5A to 5D, films are attached onto both surfaces of material sheet 2. Via-hole 8 is formed by, e.g. laser processing, and is filled with conductive paste 3. Then, the films are peeled off. Thus, conductive paste 3 protrudes from the surfaces of material sheet 2. The films are attached onto both surfaces of material sheet 2 by a laminating method using, e.g. a thermal roll. Material sheet 2 is obtained by drying woven fabric of glass fiber (a reinforcing member) impregnated with varnish of thermosetting resin, such as epoxy resin. Material sheet 2 is a pre-preg sheet in a B-stage having a thickness of 100 µm. Material sheet 2 in accordance with the embodiment, even including the woven fabric of glass fiber, protects conductive paste 3 from damage due to the displacement of yarns constituting the woven fabric during the heating and pressing. The films are made of polyethylene terephthalate (PET) having thicknesses of 20 µm. The films may be coated with thermosetting resin, such as epoxy resin. Conductive paste 3 is obtained by kneading thermosetting resin, hardening agent, solvent, and conductive particles, such as copper powder.

Figure 1A:
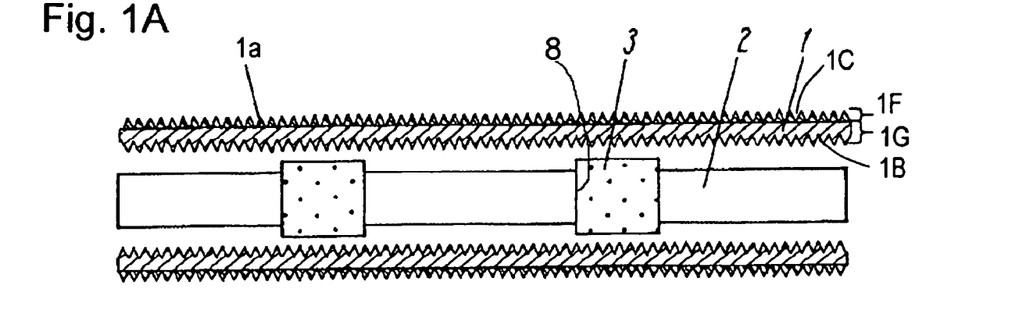
FIG. 1A is a sectional view of a circuit-forming board for illustrating a method of manufacturing the board in accordance with an exemplary embodiment of the present invention.

As shown in FIG. 1A, copper foils 1 are placed on material sheet 2 having via-hole 8 therein filled with conductive paste 3.

Figure 1B:
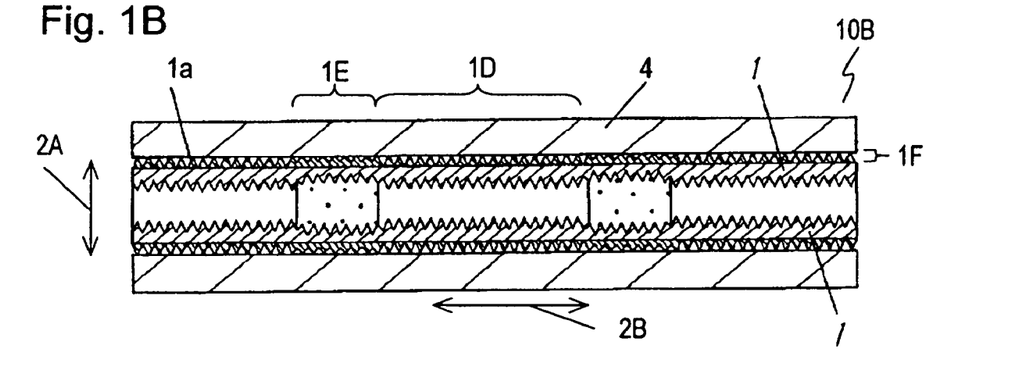
FIG. 1B is a sectional view of the circuit-forming board for illustrating the method of manufacturing the board in accordance with the embodiment.

Then, as shown in FIG. 1B, material sheet 2 and copper foils 1 are placed between metal plates 4, such as SUS plates, as to be integrated with each other by heating and pressing, providing laminated sheet 10B. Surface 1B of copper foil 1 (having a roughness Rz of about 10 µm) faces material sheet 2. Surface 1C (having a roughness Rz of about 5 µm) functions as pressure absorption portion 1a. The roughnesses of surfaces 1B and 1C of copper foil 1 are not limited particularly to these values, and the roughness of surface 1B facing material sheet 2 is preferably greater than that of surface 1C opposite to surface 1B. During the heating and pressing, pressure absorption portion 1a of surface 1C of copper foil 1 is crushed to absorb a pressure applied to it. Therefore, the pressure is not concentrated over conductive paste 3 protruding from material sheet 2. Thereby, conductive paste 3 is compressed in thickness direction 2A while paste 3 does not spread in in-plane direction 2B, thus avoiding the problem of the conventional circuit-forming board shown in FIG. 7B. That is, surface portion 1F of copper foil 1 including surface 1C corresponds to pressure absorption portion 1a. Copper foil 1 has hard portion 1G adjacent to pressure absorption portion 1a.

During the heating and pressing shown in FIG. 1B, pressure absorption portion 1a of copper foil 1 is crushed, so that the resin flows from a portion of material sheet 2, reducing the thickness of the portion of material 2. Then, the height of portion 1D of copper foil 1 on the portion of material sheet 2 becomes substantially identical to the height of portion 1E of copper foil 1 on conductive paste 3. From this moment, a pressure is applied effectively to conductive paste 3 to press conductive particles in conductive paste 3 to contact surface 1B, being electrically connected with surface 1B stably. That is, the thickness of a portion of pressure absorption portion 1a having the pressure applied thereto changes locally, thus providing the circuit-forming board of the embodiment.

Figure 1C:
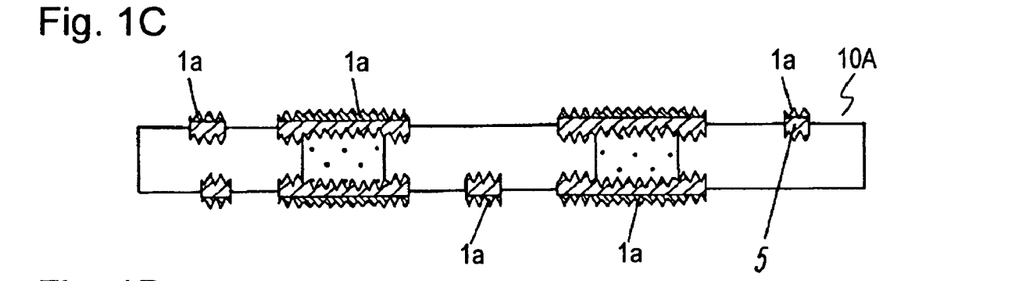
FIG. 1C is a sectional view of the circuit-forming board for illustrating the method of manufacturing the board in accordance with the embodiment.

Next, as shown in FIG. 1C, copper foil 1 is, for example, etched to form circuit pattern 5 having a predetermined shape, thus providing circuit board 10A.

Figure 1D:
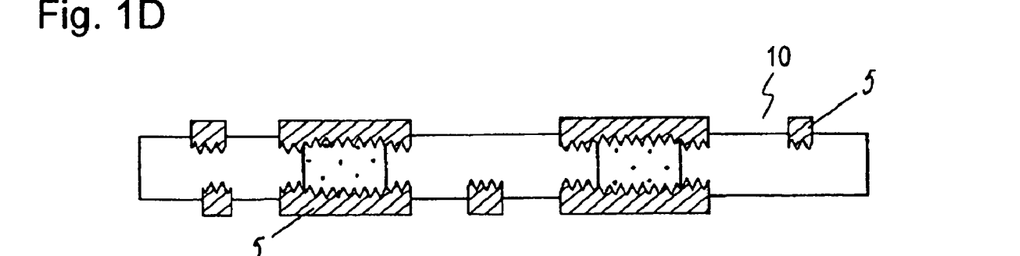
FIG. 1D is a sectional view of the circuit-forming board for illustrating the method of manufacturing the board in accordance with the embodiment.
Figure 1E:
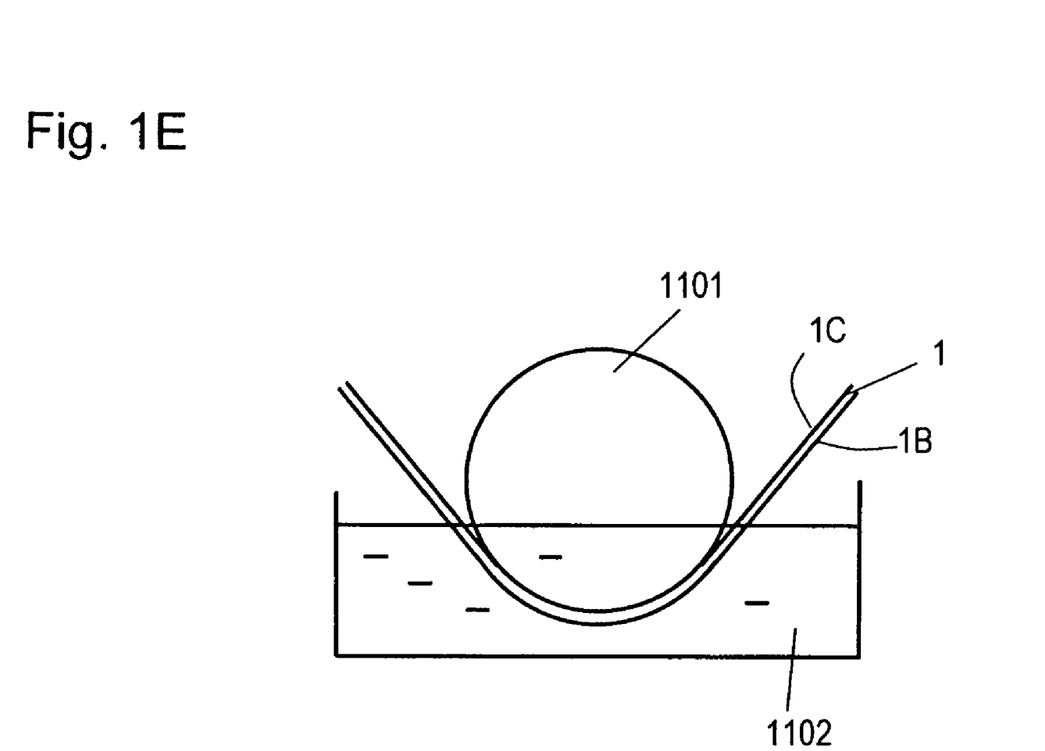
FIG. 1E is a schematic view of a processing apparatus for processing a metal foil used in the circuit-forming board in accordance with the embodiment.

Then, as shown in FIG. 1D, pressure absorption portions 1a of a surface of circuit pattern 5 are removed by buffing or slight etching to increase a wettability to soldering, thus providing circuit board 10. In order to further increase the wettability to soldering, circuit pattern 5 may be subjected to a finishing process, such as a plating process.

A solder resist may be formed on circuit pattern 5 in order to prevent pattern 5 from having an unnecessary solder attached thereto. Pressure absorption portion 1a may be removed after the solder resist is formed. Pressure absorption portion 1a may be removed before circuit pattern 5 is formed by etching.

The circuit-forming board provided by this method has a high density and a high quality. Conductive paste 3 is compressed stably to be reliably connected with copper foil 1 even if the diameter of via-hole 8 is small.

FIGS. 2A to 2E are sectional views of a multi-layer circuit board for illustrating a method of manufacturing the board in accordance with the embodiment.

Figures 2A, 2B:
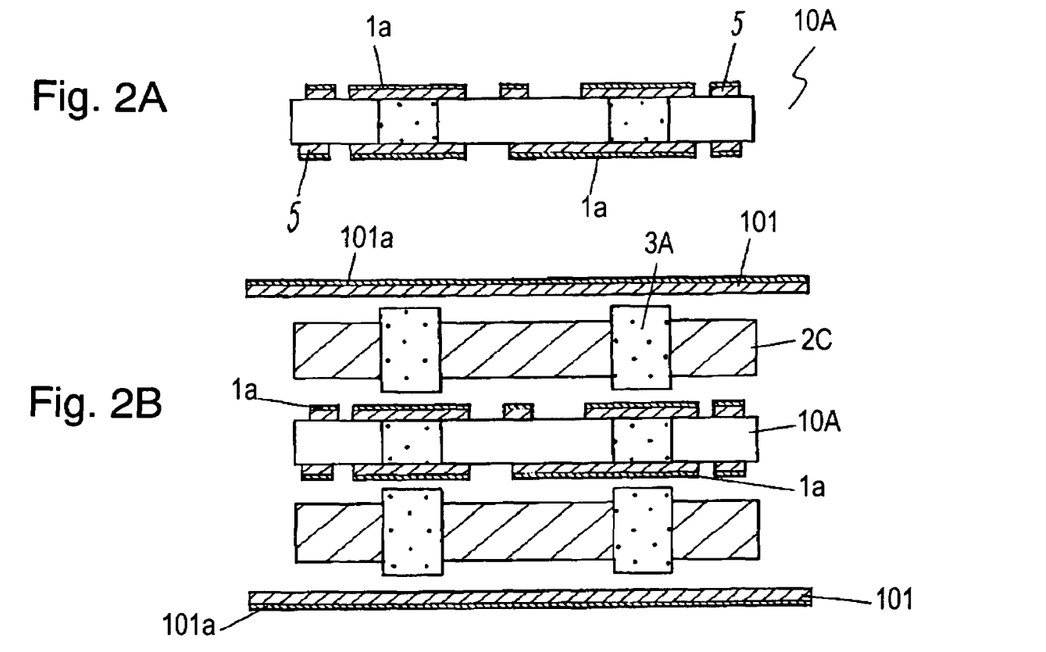
FIG. 2A is a sectional view of a circuit board for illustrating a method of manufacturing the board in accordance with the embodiment.
FIG. 2B is a sectional view of the circuit board for illustrating the method of manufacturing the board in accordance with the embodiment.

As shown in FIG. 2A, circuit board 10A shown in FIG. 1C is prepared as a core board. Pressure absorption portion 1a, a rough surface, remains on the surface of circuit pattern 5 of circuit board 10A

Figure 2C:
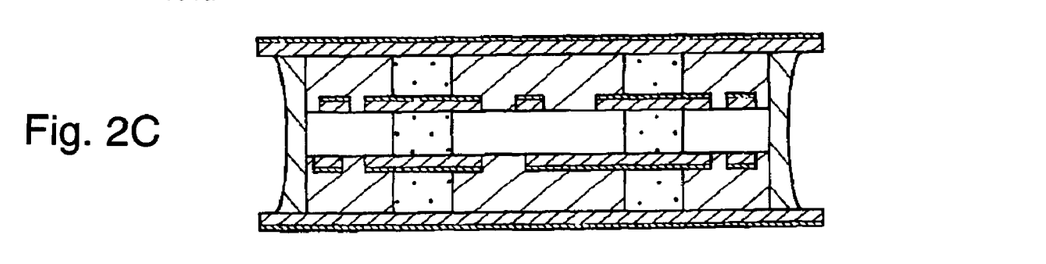
FIG. 2C is a sectional view of the circuit board for illustrating the method of manufacturing the board in accordance with the embodiment.
Figure 2D:
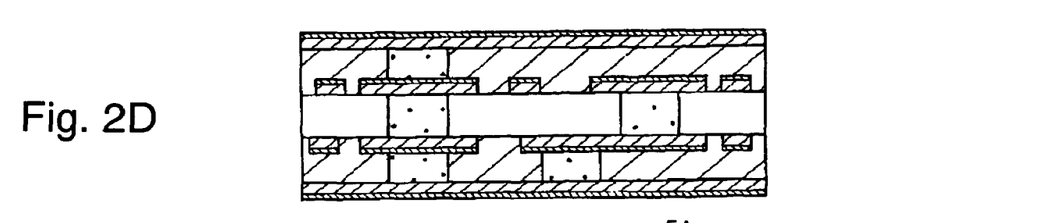
FIG. 2D is a sectional view of the circuit board for illustrating the method of manufacturing the board in accordance with the embodiment.
Figure 2E:
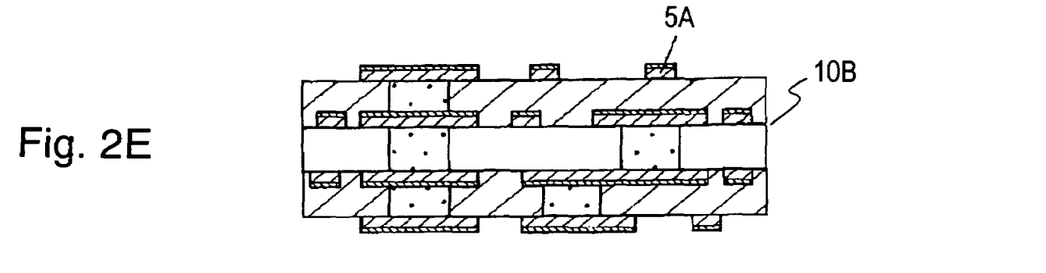
FIG. 2E is a sectional view of the circuit board for illustrating the method of manufacturing the board in accordance with the embodiment.

Next, as shown in FIGS. 2B to 2D, material sheets 2C filled with conductive paste 3A and copper foils 101 are placed on the both surfaces of circuit board 10A having pressure absorption portions 101a, and they are integrated with each other by heating and pressing. Then, as shown in FIG. 2E, copper foil 101 is etched to form circuit pattern 5A, thereby providing multi-layer circuit board 10B.

Pressure absorption portion 1a remains on the surface of circuit pattern 5A of circuit board 10A as the core board to provide the surface with a roughness. This roughness increases an adhesive strength between copper foil 1 and conductive paste 3A.

Figure 3:
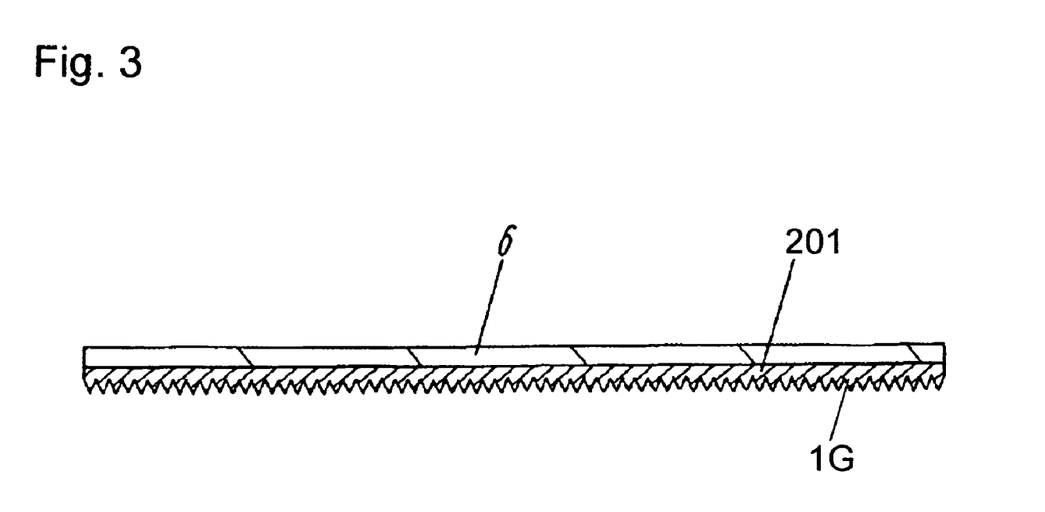
FIG. 3 is a sectional view of another metal foil of the circuit board in accordance with the embodiment.

FIG. 3 is a sectional view of copper foil 201, another metal foil of the circuit-forming board of the embodiment. Copper foil 201 is used instead of copper foil 1 shown in FIG. 1A. Instead of pressure absorption portion 1a, deformable layer 6 is formed at a surface of foil 201 opposite to a surface facing material sheet 2. The thickness of a portion of deformable layer 6 having a pressure applied thereto changes locally, similarly to pressure absorption portion 1a. Copper foil 201 includes hard portion 1G adjacent to deformable layer 6. Hard portion 1G is harder than deformable layer 6.

Deformable layer 6 deforms during the heating and pressing, and preferably, has a hardness smaller than that of copper foil 201. Deformable layer 6 may be made of various materials, such as organic material or inorganic material. Deformable layer 6, being made of inorganic material, produces fewer impurities or volatile components when it is heated. Deformable layer 6 may be made of epoxy resin or silicon resin having a large thermal resistance on copper foil 201 by casting method or a curtain coat technique to have a thickness of about 10 μm, having the same effects as those of pressure absorption portion 1a.

A circuit-forming board without conductive paste, such as a circuit-forming board including copper foil 1 and a conductive portion formed in via-hole 8 by plating, provides the same effects as those of the board of the embodiment. When copper foil 1 is heated and pressed onto the conductive portion, the conductive portion is protected from damage due to a pressure.

Material sheet 2 may be a pre-preg sheet formed of glass fiber sheet, such as woven fabric or non-woven fabric, impregnated with thermosetting resin in a B-stage. Instead of the glass fiber sheet, an organic fiber sheet, such as an aramid sheet, may be used. Furthermore, material sheet 2, instead of the fiber sheet, may be a B-stage film or a B-stage sheet composed of a resin film, such as a polyimide film, and an adhesive material.

Furthermore, material sheet 2 may be a pre-preg sheet made of combined material of woven fabric and non-woven fabric as the reinforcing member. For example, material sheet 2 may be a pre-preg sheet including two woven fabrics of glass fiber and a non-woven fabric of glass fiber between the woven fabrics.

The thermosetting resin in accordance with the embodiment may be epoxy resin, epoxy-melamine resin, unsaturated polyester resin, phenol resin, polyimide resin, cyanate resin, cyanate ester resin, naphthalene resin, urea resin, amino resin, alkyd resin, silicone resin, furan resin, polyurethane resin, aminoalkyd resin, acrylic resin, fluororesin, polyphenylene ether resin, cyanate ester resin, or mixture of two or more of the above resins. Alternatively, the thermosetting resin may have a composition modified by thermoplastic resin. Furthermore, if necessary, fire retarding material or inorganic filler may be added into the thermosetting resin.

Copper foil 1 or 201 in accordance with the embodiment may not necessarily be used for all layers of the multi-layer circuit board. In a layer of the layers near the outside of the board, a conductive portion for connecting circuit patterns (copper foils) of different layers are likely to be damaged, and therefore, copper foil 1 or 201 in accordance with the embodiment may be used for the layer near the outside. That is, copper foil 1 or 201 may be used only for the tenth layer or eighth and tenth layers of a circuit board having ten layers, providing the same effects as those of the board of the embodiment.

Figure 4A:
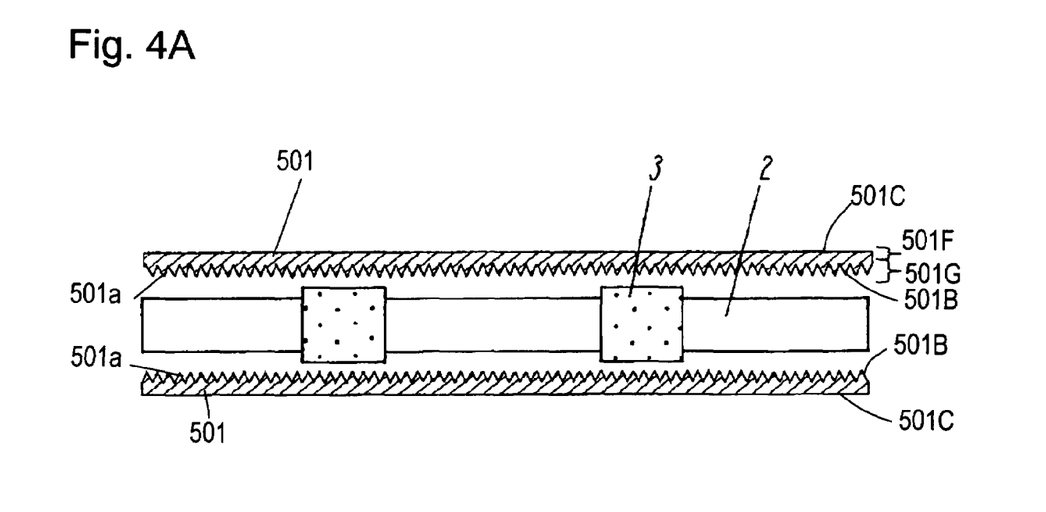
FIG. 4A is a sectional view of another circuit-forming board for illustrating a method of manufacturing the board in accordance with the embodiment.
Figure 4B:
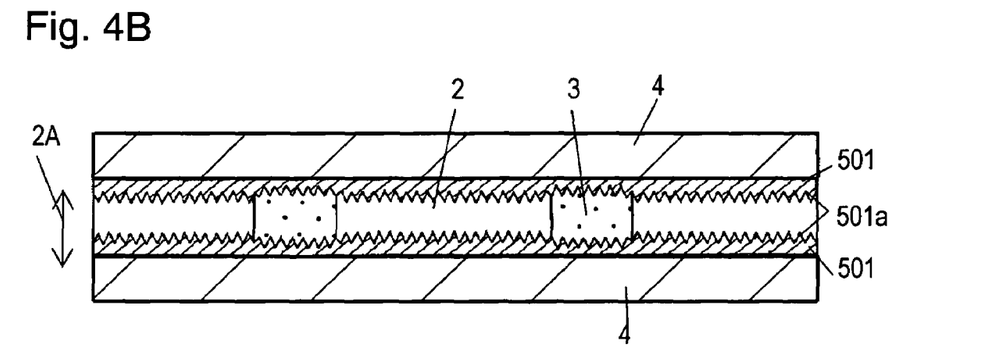
FIG. 4B is a sectional view of another circuit-forming board for illustrating the method of manufacturing the board in accordance with the embodiment.
Figure 4C:
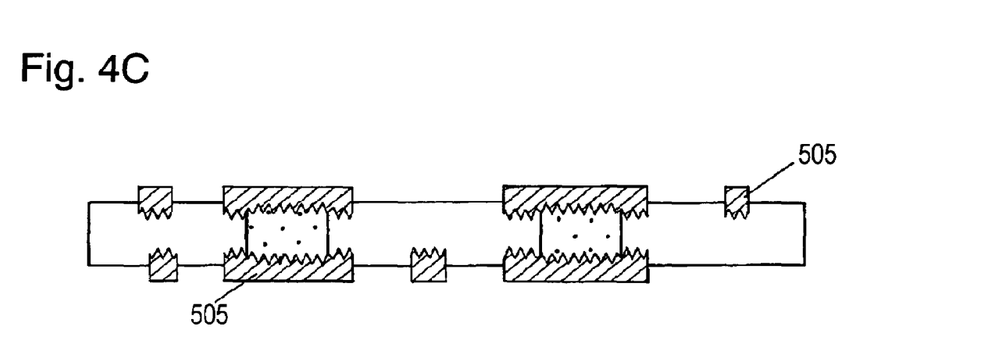
FIG. 4C is a sectional view of another circuit-forming board for illustrating the method of manufacturing the board in accordance with the embodiment.

FIGS. 4A to 4C are sectional views of another circuit-forming board for illustrating a method of manufacturing the board in accordance with the embodiment. In the circuit-forming board shown in FIGS. 1A to 1D, pressure absorption portion 1a is provided at surface 1C of copper foil 1 opposite to a surface facing material sheet 2. As shown in FIG. 4A, copper foil 501 of a metal foil has surface 501B facing material sheet 2 and has surface 501C opposite to surface 501B. Pressure absorption portion 501a is provided at surface portion 501G including surface 501B of copper foil 501. Pressure absorption portion 501a is provided with a roughness Rz of, e.g. 5 μm. Copper foil 501 has hard portion 501F adjacent to pressure absorption portion 501a, and hard portion is harder than pressure absorption portion 501a. As shown in FIG. 4B, similarly to FIG. 1B, copper foils 501 and material sheet 2 are sandwiched between metal plates 4, and a pressure is applied in thickness direction 2A. Pressure absorption portion 501a has a thickness in the direction 2A changing according to the pressure applied to it, thus providing the same effects as those of pressure absorption portion 1a shown in FIG. 1B. Then, copper foil 501 is processed, for example, by etching to form circuit pattern 505.

The conductive paste used as the conductive portion connected to the copper foil may be made of a mixture of conductive particles and polymer molecule material having an appropriate viscosity so that the paste may be released into material sheet 2 during the heating and pressing, mixture obtained by kneading conductive particles and solvent, or anisotropic conductive adhesive material.

The conductive portion formed in via-hole 8 and connected to the copper foil may employ, instead of the conductive paste, a conductive protrusion having a post shape formed by, for example, plating, or conductive particles having large particle sizes which are not formed into a paste.

INDUSTRIAL APPLICABILITY

A method of manufacturing a circuit-forming board in accordance with the present invention allows a material sheet, a metal foil, and a conductive portion, such as a conductive paste, in a via-hole formed in the material sheet to be heated and pressed, preventing the conductive portion from being damaged. This method provides a reliable electrical connection between the metal foil and the conductive portion, thus providing a circuit board with a high density and high quality.

The invention claimed is:

1. A method of manufacturing a circuit-forming board, comprising:
    providing a metal foil having a first surface and a second surface opposite to the first surface, the metal foil including a pressure absorption portion and a hard portion adjacent to the pressure absorption portion, the pressure absorption portion being provided at the first surface, the pressure absorption portion having a thickness that changes according to a pressure applied thereto;
    providing a material sheet having a surface, the surface having a hole formed therein;
    forming a conductive portion in the hole of the material sheet such that the conductive portion protrudes from the material sheet;
    providing a laminated sheet by placing the metal foil on the surface of the material sheet such that the second surface of the metal foil faces the material sheet, such that the conductive portion contacts a first portion of the second surface of the metal foil opposite to the pressure absorption portion, and such that the material sheet contacts a second portion of the second surface of the metal foil opposite to the pressure absorption portion;
    heating and pressing the laminated sheet to harden the material sheet; and
    crushing first and second portions of the pressure absorption portion of the metal foil, the first and second portions of the pressure absorption portion being opposite to the first and second portion of the second surface of the metal foil, respectively, during said heating and pressing of the laminated sheet such that a thickness of the first portion of the pressure absorption portion is smaller than a thickness of the second portion of the pressure absorption portion.

2. The method according to claim 1, wherein, in said providing of the metal foil, the hard portion of the metal foil is harder than the pressure absorption portion of the metal foil.

3. The method according to claim 1, wherein, in said providing of the metal foil, the first surface of the metal foil is roughened, and the pressure absorption portion comprises a surface portion of the metal foil including the first surface of the metal foil.

4. The method according to claim 3,
    wherein said providing of the metal foil comprises roughening the second surface of the metal foil, and
    wherein the second surface of the metal foil is rougher than the first surface of the metal foil.

5. The method according to claim 1, wherein, in said providing of the metal foil, the pressure absorption portion of the metal foil comprises deformable organic material.

6. The method according to claim 1, wherein, in said providing of the metal foil, the pressure absorption portion of the metal foil comprises deformable inorganic material.

7. The method according to claim 1, further comprising removing the pressure absorption portion after said heating and pressing of the laminated sheet.

8. The method according to claim 1, wherein said forming of the conductive portion in the hole of the material sheet comprises filling the hole of the material sheet with a conductive paste.

9. The method according to claim 1,
    wherein said providing of the metal foil comprises roughening the second surface of the metal foil, and
    wherein the second surface of the metal foil is rougher than the first surface of the metal foil.

10. The method according to claim 1, wherein, in said providing of the metal foil, the second surface of the metal foil is rougher than the first surface of the metal foil.

11. The method according to claim 1, wherein, in said crushing of the pressure absorption portion of the metal foil; the pressure absorption portion of the metal foil is crushed to absorb pressure applied thereto.

12. The method according to claim 1, wherein, in said providing of the metal foil, the hard portion is constituted by a hard layer, and the pressure absorption portion is constituted by a pressure absorption layer on said hard layer at the first surface of the metal foil and on a side of said hard layer opposite the second surface of the metal foil.

13. A method of manufacturing a circuit-forming board, comprising:
    providing a metal foil having a first surface and a second surface opposite to the first surface, the metal foil including a pressure absorption portion and a hard portion adjacent to the pressure absorption portion, the pressure absorption portion being provided at the first surface, the pressure absorption portion having a thickness that changes according to a pressure applied thereto;
    providing a material sheet having a surface, the surface having a hole formed therein;
    forming a conductive portion in the hole of the material sheet;
    providing a laminated sheet by placing the metal foil on the surface of the material sheet such that the second surface of the metal foil faces the material sheet, and such that the conductive portion contacts a portion of the second surface of the metal foil opposite to the pressure absorption portion;
    heating and pressing the laminated sheet to harden the material sheet; and crushing the pressure absorption portion of the metal foil during said heating and pressing of the laminated sheet, wherein, in said providing of the metal foil, the first surface of the metal foil is roughened, and the pressure absorption portion comprises a surface portion of the metal foil including the first surface of the metal foil, wherein said providing of the metal foil comprises roughening the second surface of the metal foil, and wherein the second surface of the metal foil is rougher than the first surface of the metal foil.

14. The method according to claim 13, wherein, in said providing of the metal foil, the hard portion of the metal foil is harder than the pressure absorption portion of the metal foil.

15. The method according to claim 13, wherein, in said providing of the metal foil, the pressure absorption portion of the metal foil comprises deformable organic material.

16. The method according to claim 13, wherein, in said providing of the metal foil, the pressure absorption portion of the metal foil comprises deformable inorganic material.

17. The method according to claim 13, further comprising removing the pressure absorption portion after said heating and pressing of the laminated sheet.

18. The method according to claim 13, wherein said forming of the conductive portion in the hole of the material sheet comprises filling the hole of the material sheet with a conductive paste.

19. The method according to claim 13, wherein, in said crushing of the pressure absorption portion of the metal foil, the pressure absorption portion of the metal foil is crushed to absorb pressure applied thereto.

20. The method according to claim 13, wherein, in said providing of the metal foil, the hard portion is constituted by a hard layer, and the pressure absorption portion is constituted by a pressure absorption layer on said hard layer at the first surface of the metal foil and on a side of said hard layer opposite the second surface of the metal foil.

* * * * *